US009653163B2

(12) United States Patent
Di Pendina

(10) Patent No.: US 9,653,163 B2
(45) Date of Patent: *May 16, 2017

(54) MEMORY CELL WITH NON-VOLATILE DATA STORAGE

(71) Applicants: Centre National de la Recherche Scientifique, Paris (FR); Commissariat à l'énergie atomique et aux énergies alternatives, Paris (FR)

(72) Inventor: Gregory Di Pendina, Echirolles (FR)

(73) Assignees: Commisariat à l'énergie atomique et aux énergies alternatives (FR); Centre National de la Recherche Scientifique (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/784,871

(22) PCT Filed: Apr. 15, 2014

(86) PCT No.: PCT/FR2014/050913
§ 371 (c)(1),
(2) Date: Oct. 15, 2015

(87) PCT Pub. No.: WO2014/170594
PCT Pub. Date: Oct. 23, 2014

(65) Prior Publication Data
US 2016/0064077 A1    Mar. 3, 2016

(30) Foreign Application Priority Data
Apr. 15, 2013   (FR) ..................... 13 53398

(51) Int. Cl.
*G11C 11/00*   (2006.01)
*G11C 13/00*   (2006.01)
(Continued)

(52) U.S. Cl.
CPC ...... *G11C 13/0069* (2013.01); *G11C 11/1675* (2013.01); *G11C 11/2275* (2013.01);
(Continued)

(58) Field of Classification Search
CPC ............ G11C 13/0069; G11C 13/0064; G11C 13/0002; G11C 14/0072; G11C 14/0081;
(Continued)

(56) References Cited

U.S. PATENT DOCUMENTS 4,006,469  A    2/1977   Leehan et al.
5,973,965  A   10/1999   Berthold et al.
(Continued)

FOREIGN PATENT DOCUMENTS

EP    1134746 A2   9/2001
FR    2970590 A1   1/2011
(Continued)

OTHER PUBLICATIONS

"English Translation of the International Preliminary Report on Patentability", issued in counterpart International Application No. PCT/FR2014/050913 on Oct. 20, 2015.
(Continued)

*Primary Examiner* — Toan Le
(74) *Attorney, Agent, or Firm* — Kaplan Breyer Schwartz & Ottesen, LLP

(57) ABSTRACT

The invention concerns a memory cell comprising first and second resistive elements (202, 204) coupled respectively between first and second storage nodes and first and second intermediate nodes, at least one of them being programmable to take up one of at least two resistive states ($_{Rmin}$, Rmax); a third transistor (220) coupled between the first and second intermediate nodes; a fourth transistor (502) coupled between the first storage node (206, 210) and a data input node (506); and a control circuit arranged, during a write
(Continued)

phase, to activate the third and fourth transistors and to couple the data input node to a second supply voltage (VDD, GND) via a first circuit block (508) in order to generate a current in a first direction through the first and second resistive elements in order to program the resistive state of at least one of the elements.

15 Claims, 6 Drawing Sheets

(51) Int. Cl.
   *G11C 14/00* (2006.01)
   *G11C 11/22* (2006.01)
   *G11C 11/16* (2006.01)

(52) U.S. Cl.
   CPC ........ *G11C 13/0004* (2013.01); *G11C 14/009* (2013.01); *G11C 14/0072* (2013.01); *G11C 14/0081* (2013.01); *G11C 11/16* (2013.01); *G11C 13/0002* (2013.01)

(58) Field of Classification Search
   CPC .............. G11C 14/009; G11C 11/1675; G11C 11/2275; G11C 11/16
   See application file for complete search history.

(56) References Cited

U.S. PATENT DOCUMENTS

| | | |
|---|---|---|
| 6,172,899 B1 | 1/2001 | Marr et al. |
| 6,457,108 B1 | 9/2002 | Hsu et al. |
| 6,493,259 B1 | 12/2002 | Swanson et al. |
| 6,717,844 B1 | 4/2004 | Ohtani |
| 6,973,003 B1 | 12/2005 | Salleh et al. |
| 7,495,945 B2 | 2/2009 | Roehr |
| 7,760,538 B1 | 7/2010 | Paak |
| 7,764,081 B1 | 7/2010 | Tuan et al. |
| 7,796,417 B1 | 9/2010 | Lewis |
| 8,154,916 B2 | 4/2012 | Sugiyama et al. |
| 8,422,295 B1 | 4/2013 | Lin et al. |
| 8,508,983 B2 | 8/2013 | Wang et al. |
| 8,605,490 B2 | 12/2013 | Fackenthal |
| 8,773,896 B2 | 7/2014 | Shukh |
| 9,042,157 B2 | 5/2015 | Guillemenet et al. |
| 9,053,782 B2 | 6/2015 | Guillemenet et al. |
| 9,059,705 B1 | 6/2015 | Edelhaeuser |
| 9,117,521 B2 | 8/2015 | Guillemenet |
| 9,224,463 B2 | 12/2015 | Guillemenet et al. |
| 9,368,204 B2 | 6/2016 | Guillemenet et al. |
| 2003/0122578 A1 | 7/2003 | Masui et al. |
| 2003/0161184 A1 | 8/2003 | Lee et al. |
| 2003/0204689 A1 | 10/2003 | Shimoda |
| 2004/0125643 A1 | 7/2004 | Kang et al. |
| 2004/0141363 A1 | 7/2004 | Ohtsuka et al. |
| 2004/0222817 A1 | 11/2004 | Madurawe |
| 2005/0128791 A1 | 6/2005 | Kang |
| 2006/0146602 A1 | 7/2006 | Lin et al. |
| 2006/0181916 A1 | 8/2006 | Roehr |
| 2007/0041242 A1* | 2/2007 | Okazaki ................ G11C 11/412 365/154 |
| 2008/0062750 A1 | 3/2008 | Jeong et al. |
| 2008/0089146 A1 | 4/2008 | Fujito et al. |
| 2008/0247249 A1 | 10/2008 | Lee |
| 2009/0109734 A1 | 4/2009 | Hanafi |
| 2009/0190409 A1 | 7/2009 | Dittrich et al. |
| 2009/0268513 A1 | 10/2009 | De Ambroggi et al. |
| 2010/0080042 A1 | 4/2010 | Lamorey |
| 2010/0188891 A1 | 7/2010 | Taniguchi et al. |
| 2010/0202191 A1 | 8/2010 | Ahn et al. |
| 2010/0208512 A1 | 8/2010 | Ueda |
| 2010/0259975 A1 | 10/2010 | Toda |
| 2010/0271866 A1 | 10/2010 | Sakimura et al. |
| 2011/0007554 A1 | 1/2011 | Kaeriyama et al. |
| 2011/0058406 A1 | 3/2011 | Ma et al. |
| 2011/0085372 A1 | 4/2011 | Fackenthal |
| 2011/0095255 A1 | 4/2011 | Sumino et al. |
| 2011/0110142 A1 | 5/2011 | Kitagawa et al. |
| 2011/0122709 A1 | 5/2011 | Kim et al. |
| 2011/0208904 A1 | 8/2011 | Fujito et al. |
| 2012/0001672 A1 | 1/2012 | Barrow |
| 2012/0081977 A1 | 4/2012 | Widjaja et al. |
| 2012/0320658 A1* | 12/2012 | Wang .................. G11C 14/0054 365/148 |
| 2013/0135008 A1 | 5/2013 | Zhang et al. |
| 2013/0223131 A1 | 8/2013 | Takagi et al. |
| 2013/0223133 A1 | 8/2013 | Azuma et al. |
| 2014/0043062 A1 | 2/2014 | Guillemenet et al. |
| 2014/0050012 A1 | 2/2014 | Guillemenet et al. |
| 2014/0078810 A1* | 3/2014 | Prenat ..................... G11C 11/16 365/148 |
| 2014/0167816 A1 | 6/2014 | Guillemenet et al. |
| 2014/0269003 A1 | 9/2014 | Guillemenet et al. |
| 2015/0009744 A1 | 1/2015 | Di Pendina et al. |
| 2015/0036415 A1 | 2/2015 | DiPendina et al. |
| 2015/0084671 A1 | 3/2015 | Prenat et al. |
| 2016/0055908 A1* | 2/2016 | Prenat ................ G11C 13/0069 365/51 |
| 2016/0064077 A1 | 3/2016 | Di Pendina |

FOREIGN PATENT DOCUMENTS

| | | |
|---|---|---|
| FR | 2966636 A1 | 4/2012 |
| FR | 2970589 A1 | 7/2012 |
| JP | 2003157671 A | 5/2003 |
| WO | 2007045202 A1 | 4/2007 |
| WO | 2008112746 A2 | 9/2008 |
| WO | 2010065691 | 6/2010 |
| WO | 2011037143 A1 | 3/2011 |
| WO | 2012098181 A1 | 7/2012 |

OTHER PUBLICATIONS

"International Search Report and Written Opinion of the International Searching Authority", dated Jun. 6, 2014, issued in International Application No. PCT/FR2014/050913.

Mojumder et al., "Magnonic spin-transfer torque MRAM with low power, high speed, and error-free switching", "Transactions on Magnetics", Dec. 15, 2011, pp. 2016-2024, vol. 48, No. 6, Publisher: IEEE; DOI:10.1109/ TMAG.2011.2179982; ISSN :0018-9464.

Jung, et al., "MTJ based Non-Volatile Flip-flop in Deep Submicron Technology", "2011 International SoC Design Conference (ISOCC)", Nov. 17-18, 2011, pp. 424-427, Publisher: IEEE; ISOCC 2011; E-ISBN :978-1-4577-0710-0; DOI:10.1109/ISOCC.2011.6138622.

Waser et al., "Redox-Based Resistive Switching Memories—Nanoionic Mechanisms, Prospects, and Challenges", "Advanced Materials", Jul. 13, 2009, pp. 2632-2661, vol. 21, No. 25-26, Publisher: Wiley-VCH Verlag Gmbh & Go.; DOI: 10.1002/adma.200900375.

Zhao et al., "Spin-MTJ based Non-Volatile Flip-Flop", "International Conference on Nanotechnology", Aug. 2-5, 2007, pp. 399-402, Publisher: IEEE; E-ISBN :978-1-4244-0608-1; DOI:10.1109/NANO.2007.4601218.

Evgeny Y. Tsymbal, "Spintronics: Electric toggling of magnets", "Nature Materials", Dec. 15, 2011, pp. 12-13, vol. 11, Publisher: Macmillian Publishers Limited; doi:10.1038/nmat3205.

Yamamoto, et al., "Nonvolatile Static Random Access Memory Using Resistive Switching Devices: Variable-Transconductance Metal Oxide Semiconductor Field-Effect-Transistor Approach", "Japanese Journal of Applied Physics", Apr. 1, 2010, pp. 40209-1, vol. 49, No. 4, Publisher: Japan Society of Applied Physics, Published in: JP.

Yoann Guillemenet et al, "A Non-Volatile Run-Time FPGA Using Thermally Assisted Switching MRAMS", pp. 421-426.

William C. Black, Jr., et al., "Programmable logic using giant-magnetoresistance and spin-dependent tunneling devices (invited)";

(56) References Cited

OTHER PUBLICATIONS

"Journal of Applied Physics"; Publisher: AIP Publishing; http://dx.doi.org/10.1063/1.372806; vol. 87; No. 9; pp. 6674-6679.
Zhao et al., "TAS-MRAM based Non-volatile FPGA logic circuit", Dec. 1, 2007, pp. 153-160, Publisher: International Conference on Field-Programmable Technology. ICFPT 2007. IEEE, XP031208385.
"Notice of Allowance" issued in related U.S. Appl. No. 13/980,559, dated Oct. 15, 2015.
"Supplemental Notice of Allowance" issued in related U.S. Appl. No. 13/980,559, dated Feb. 1, 2016.
"Supplemental Notice of Allowance" issued in related U.S. Appl. No. 14/784,896, dated Jul. 21, 2016.
"Notice of Allowance" issued in related U.S. Appl. No. 13/980,529, dated Aug. 18, 2015, Publisher: USPTO, Published in: US.
"Office Action" issued in related U.S. Appl. No. 13/980,559, dated May 19, 2015, Publisher: USPTO, Published in: US.
"French Search Report" issued in related French Patent Application No. 1357536, dated Jun. 12, 2014, Published in: FR.
Officer: Balaguer Lopez, J, "International Search Report", dated Sep. 6, 2012, issued in related International Application No. PCT/EP2012/061267 (counterpart to U.S. Appl. No. 14/126,051).
Authorized Officer: Jim Lindquist, "International Search Report" issued in related application No. PCT/EP2012/061268, dated Dec. 17, 2012.
"Notice of Allowance" issued in related U.S. Appl. No. 14/324,110, dated Dec. 4, 2015, Publisher: USPTO, Published in: US.
International Patent Application No. 2014-050912 "Written Opinion of the International Search Authority", dated Oct. 23, 2014.
"International Search Report and Written Opinion of the International Searching Authority", dated Jun. 6, 2014, issued in International Application No. PCT/FR2014/050912.
"Notice of Allowance" issued in related U.S. Appl. No. 14/784,896, dated Mar. 29, 2016, Published in: US.
"International Preliminary Report on Patentability and Written Opinion" issued in related application No. PCT/FR2013/050910, dated Oct. 28, 2014.
"Notice of Allowance" issued in related U.S. Appl. No. 14/395,555, dated Jun. 1, 2016, Publisher: USPTO, Published in: US.
"Office Action" issued in related U.S. Appl. No. 14/395,555, dated Feb. 11, 2016, Publisher: USPTO, Published in: US.
"Office Action" issued in related U.S. Appl. No. 14/446,044, dated Jun. 22, 2015, Publisher: USPTO, Published in: US.
"International Search Report"; dated Jul. 19, 2013, issued in related International Application No. PCT/FR2013/050910 (counterpart to related U.S. Appl. No. 14/395,555).
"International Preliminary Report on Patentability", dated Jul. 23, 2013, issued in related International Application No. PCT/EP2012/050800 (counterpart to related U.S. Appl. No. 13/980,529).
Damien Czarik, "International Search Report"; dated May 7, 2012, issued in related International Patent Application No. PCT/EP2012/050800 (counterpart to related U.S. Appl. No. 13/980,529).
Dylan C. White, "Non-Final Office Action"; dated Dec. 29, 2014, issued in related U.S. Appl. No. 13/980,529.
"Final Office Action"; issued in related U.S. Appl. No. 13/980,529 on Apr. 30, 2015.
"International Preliminary Report on Patentability", dated Jul. 23, 2013, issued in related International Application No. PCT/EP2012/050798 (counterpart to related U.S. Appl. No. 13/980,555).
Damien Czarik, "International Search Report", dated Feb. 29, 2012, issued in related International Patent Application No. PCT/EP2012/050798 (counterpart to related U.S. Appl. No. 13/980,555).
"Office Action" issued in related U.S. Appl. No. 13/980,555 on Apr. 28, 2015.
"International Preliminary Report on Patentability" dated Jul. 23, 2013, issued in related International Application No. PCT/EP2012/050772 (counterpart to related U.S. Appl. No. 13/980,558).
"International Search Report", dated Jul. 12, 2012, issued in related International Patent Application No. PCT/EP2012/050772.
"Supplemental Notice of Allowance", dated Jan. 21, 2015, issued in related U.S. Appl. No. 13/980,558.
"Supplemental Notice of Allowance", dated Dec. 4, 2014, issued in related U.S. Appl. No. 13/980,558.
Nguyen, Tan, "Notice of Allowance", dated Sep. 26, 2014, issued in related U.S. Appl. No. 13/980,558.
"International Preliminary Report on Patentability", dated Jul. 23, 2013, issued in related International Application No. PCT/EP2012/050767 (counterpart to related U.S. Appl. No. 13/980,559.).
"International Search Report", dated May 7, 2012, issued in related International Patent Application No. PCT/EP2012/050767 (counterpart to related U.S. Appl. No. 13/980,559.), Dec. 27, 2016.
"International Preliminary Report on Patentability", dated Dec. 17, 2013, issued in related International Application No. PCT/EP2012/061267.
"Supplmental Notice of Allowance", dated Feb. 9, 2015, issued in related U.S. Appl. No. 14/126,051.
"Supplemental Notice of Allowance", dated Feb. 20, 2015, issued in related U.S. Appl. No. 14/126,051.
"Notice of Allowance" issued in related U.S. Appl. No. 14/126,051 on Sep. 26, 2014.
"Supplemental Notice of Allowance", dated Jan. 2, 2015, issued in related U.S. Appl. No. 14/126,051.
Officer: Agnes Wittmann-Regis, "International Preliminary Report on Patentability" dated Dec. 17, 2012, issued in related International Patent Application No. PCT/EP2012/061268 (counterpart to related U.S. Appl. No. 14/126,067.).
"Notice of Allowance", dated Apr. 17, 2015, issued in related U.S. Appl. No. 14/126,067, Dec. 27, 2016.
"NonFinal Office Action", dated Oct. 8, 2014, issued in related U.S. Appl. No. 14/126,067.
Balaguer Lopez, J., "European Search Report", dated Nov. 13, 2014, issued in related EP Application No. 14175842.5 (counterpart to related U.S. Appl. No. 14/324,110.).
Balaguer Lopez, J., "French Search Report", dated Mar. 7, 2014, for related French Patent Application No. 13/56637, which corresponds to related U.S. Appl. No. 14/324,110.
G. Grynkewich et al, "Nonvolatile Magnetoresistive Random-Access Memory Based on Magnetic Tunnel Junctions", MRS Bulletin; Nov. 2014, pp. 818-821; Publisher: www.mrs.org/publications/bulletin; XP007901070.
"NonFinal Office Action" issued in related U.S. Appl. No. 14/324,110, Jul. 28, 2015, Publisher: USPTO, Published in: US.
Yue Zhang et al, "Compact Modeling of Perpendicular-Anisotrophy CoFeB/MgO Magnetic Tunnel Junctions", Mar. 2012, pp. 819-826, vol. 59, No. 3.
Lionel Torres et al., "Evaluation of hybrid MRAM/CMOS cells for reconfigurable computing" Published in: FR.
Luqiao Liu, et al, "Magnetic switching by spin torque from the spin Hall effect" Published in: US.
Saied Tehrani, et al, "Magnetoresistive Random Access Memory Using Magnetic Tunnel Junctions", "Proceedings of the IEEE", May 2003, pp. 703-714, vol. 91, No. 5.
Ioan Mihai Miron et al, "Perpendicular switching of a single ferromagnetic layer induced by in-plane current injection", "Nature; DOI: 10.1038/nature10309.11", Aug. 11, 2011, pp. 189-194, vol. 476, Publisher: Macmillan Publishers Limited.
L. Q. Liu et al., "Spin-Torque Switching with the Giant Spin Hall Effect of Tantalum", 2012, vol. 336, No. 555.
I L Prejbeanu et al., "Thermally assisted MRAM", "Journal of Physics: Condensed Matter", Apr. 6, 2007, p. 23 Publisher: IOP Publishing, Published in: UK.
IBM, "Combined Single/Dual-Port Array Approach with 6-Device Cell", "IBM Technical Disclosure Bulletin", Jun. 1, 1988, pp. 291-292, vol. 31, No. 1, Publisher: IBM Corp., Published in: US.
Sasikanth Manipatruni et al, "Voltage and Energy-Delay Performance of Giant Spin Hall Effect Switching for Magnetic Memory and Logic", pp. 1-16, Dec. 27, 2016.

* cited by examiner

MEMORY CELL WITH NON-VOLATILE DATA STORAGE

FIELD

The present disclosure relates to a memory cell and to a method of non-volatile storage of a data value in a memory cell. In particular, the present disclosure relates to a memory cell and method comprising one or more resistive elements capable of being programmed by the direction of a current.

BACKGROUND

It has been proposed to use programmable resistive elements in memory cells to provide non-volatile data storage. Such resistive elements are programmable to adopt one of a plurality of different resistive states. The programmed resistive state is maintained even when a supply voltage of the memory cell is disconnected, and therefore data can be stored by such elements in a non-volatile fashion.

Various types of resistive elements have been proposed, some of which are capable of being programmed by the direction of a current that is passed through the resistive elements. An example of such a current-programmable resistive element is an STT (spin transfer torque) element, which is based on magnetic tunnelling junctions (MTJs).

Due at least in part to the transistors used for programming the resistor states, memory cells based on programmable resistive elements tend to be less compact than other types of memory cells such as those of a RAM (random access memory). There is a general need in the art for a memory cell based on programmable resistive elements having a reduced surface area.

SUMMARY

It is an aim of embodiments of the present description to at least partially address one or more needs in the prior art.

According to one aspect, there is provided a memory cell comprising: first and second resistive elements, at least one of which is programmable to have one of at least two resistive states, a data value being represented by the relative resistances of the first and second resistive elements, the first resistive element being coupled between a first storage node and a first intermediate node, the second resistive element being coupled between a second storage node and a second intermediate node; a first transistor coupled between the first storage node and a first supply voltage; a second transistor coupled between said second storage node and said first supply voltage, wherein a control node of said first transistor is coupled to said second storage node and a control node of the second transistor is coupled to the first storage node; a third transistor coupled between the first and second intermediate nodes; a fourth transistor coupled by its main current nodes between said first storage node and a data input node; and control circuitry configured, during a write phase, to activate said third and fourth transistors and to couple the data input node to a second supply voltage via a first circuit block to generate a current in a first direction through the first and second resistive elements to program the resistive state of at least one of the elements.

According to one embodiment, the first circuit block comprises at least one transistor coupled between said data input node and said second supply voltage and controlled by input data of said memory cell.

According to one embodiment, the memory cell further comprises a second circuit block comprising at least one transistor coupled between the data input node and the first supply voltage and controlled by the input data of the memory cell.

According to one embodiment, the first and second circuit blocks are configured to apply to the input data at least one of the group of logic functions comprising: a multiplexing function; a NOT function; a NOR function; a NAND function; an XNOR function; an OR function; an AND function; and an XOR function.

According to one embodiment, the memory cell further comprises a fifth transistor coupled between the second storage node and the second supply voltage, wherein the control circuitry is further configured, during a further write phase, to activate the third and fifth transistors to generate a programming current in a second direction through the first and second resistive elements to program the resistive state of at least one the elements.

According to one embodiment, the memory cell further comprises a sixth transistor coupled between the second storage node and a further data input node, wherein the control circuitry is further configured, during a further write phase, to activate the third and sixth transistors and to couple the further data input node to the second supply voltage via a further circuit block to generate a programming current in a second direction through the first and second resistive elements to program the resistive state of at least one of the elements.

According to one embodiment, the memory cell further comprises an inverter coupled between the first storage node and the second storage node, wherein the control circuitry is further configured, during a further write phase, to activate the third and fourth transistors and to couple the data input node to the first supply voltage via the second circuit block to generate a programming current in a second direction through the first and second resistive elements to program the resistive state of at least one of the elements.

According to one embodiment, each of the first and second transistors is connected to the first supply voltage.

According to one embodiment, at least one of the first and second resistive elements is one of: a spin transfer torque element with in-plane anisotropy; a spin transfer torque element with perpendicular-to-plane anisotropy; a reduction oxide (RedOx) element; a ferro-electric element; and a phase change element.

According to one embodiment, each of the first and second transistors comprises a bulk node, and the control circuitry is further configured to couple the bulk node of at least one of the first and second transistors to a third supply voltage different from the first supply voltage while the data input node is coupled to the second supply voltage.

According to one embodiment, the memory cell further comprises a seventh transistor coupled between the first intermediate node and the second supply voltage; and an eighth transistor coupled between the second intermediate node and the second supply voltage, the seventh and eighth transistors for example being adapted to have a lower threshold voltage than the first and second transistors.

According to a further aspect, there is provided a memory device comprising: an array of the above memory cells, wherein the data input nodes of the memory cells are coupled to first bit lines of the memory device.

According to a further aspect, there is provided a synchronous memory device comprising the above memory cell and a further memory cell coupled in series with the memory cell, the further memory cell comprising a pair of cross-coupled inverters.

According to a further aspect, there is provided a method of non-volatile storage of a data value in a memory cell, the memory cell comprising first and second resistive elements, at least one of which is programmable to have one of at least two resistive states, a data value being represented by the relative resistances of the first and second resistive elements, the first resistive element being coupled between a first storage node and a first intermediate node, the second resistive element being coupled between a second storage node and a second intermediate node; a first transistor coupled between the first storage node and a first supply voltage; a second transistor coupled between the second storage node and the first supply voltage, wherein a control node of the first transistor is coupled to the second storage node and a control node of the second transistor is coupled to the first storage node; a third transistor coupled between the first and second intermediate nodes; a fourth transistor coupled by its main current nodes between the first storage node and a data input node, the method comprising: activating the third and fourth transistors; coupling the data input node to a second supply voltage via a first input circuit block while the third and fourth transistors are activated to generate a programming current in a first direction through the first and second resistive elements to program the resistive state of at least one of the elements.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 5 schematically illustrates a memory cell according to a further example embodiment of the present disclosure;

DETAILED DESCRIPTION

Throughout the following description, the term "connected" is used to refer to a direct connection between one element and another, while the term "coupled" implies that the connection between the two elements may be direct, or via an intermediate element, such as a transistor, resistor or other component.

Figure 1:
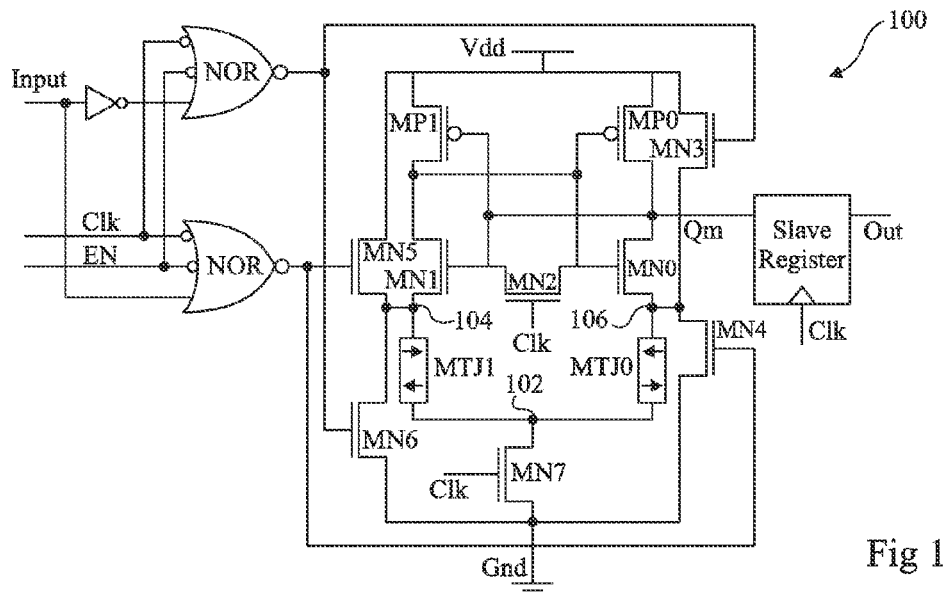
FIG. 1 schematically illustrates a memory cell that has been proposed.

FIG. 1 substantially reproduces FIG. 7 of the publication entitled "Spin-MTJ based Non-Volatile Flip-Flop", Weisheng Zhao et al., Proceedings of the 7th IEEE International Conference on Nanotechnology, Aug. 2-5, 2007, Hong-Kong.

The flip-flop 100 represented in FIG. 1 comprises a master register and a slave register. The master register comprises magnetic tunnel junction devices MTJ1 and MTJ0, programmable by a current. Device MTJ1 is connected between an intermediate node 104 and an interconnection node 102. Device MTJ0 is connected between an intermediate node 106 and the interconnection node 102. The interconnection node 102 connects together the MTJ devices MTJ0 and MTJ1. The intermediate node 104 is further coupled to a supply voltage Vdd via a pair of transistors MN1 and MP1 coupled in series and forming a first inverter. The intermediate node 106 is further coupled to the supply voltage Vdd via a pair of transistors MP0 and MN0 coupled in series and forming a second inverter. The first and second inverters are cross-coupled with each other, and the output of the second inverter is connected to the slave register. A transistor MN2 is coupled between the gate nodes of transistors MN1 and MN0.

A transistor MN5 is coupled between the intermediate node 104 and the supply voltage Vdd, and a transistor MN6 is coupled between the intermediate node 104 and ground. Furthermore, a transistor MN3 is coupled between the intermediate node 106 and the supply voltage Vdd, and a transistor MN4 is coupled between the intermediate node 106 and ground. A transistor MN7 is coupled between the interconnection node 102 and ground. The transistors MN3 to MN6 permit a current to be passed through the resistive elements MTJ1 and MTJ0 in one direction or the other in order to program the resistive states of the MJT devices. During this programming phase, the transistor MN7 is used to disconnect the node 102 from ground.

A pair of NOR gates and an inverter on the left-hand side of FIG. 1, which are controlled by an input signal, a clock signal Clk and an enable signal EN, generate signals for controlling the transistors MN3 to MN6.

A drawback of the circuit of FIG. 1 is that the master register comprises a total of 10 transistors, not counting those of the NOR gates and inverter.

Figure 2:
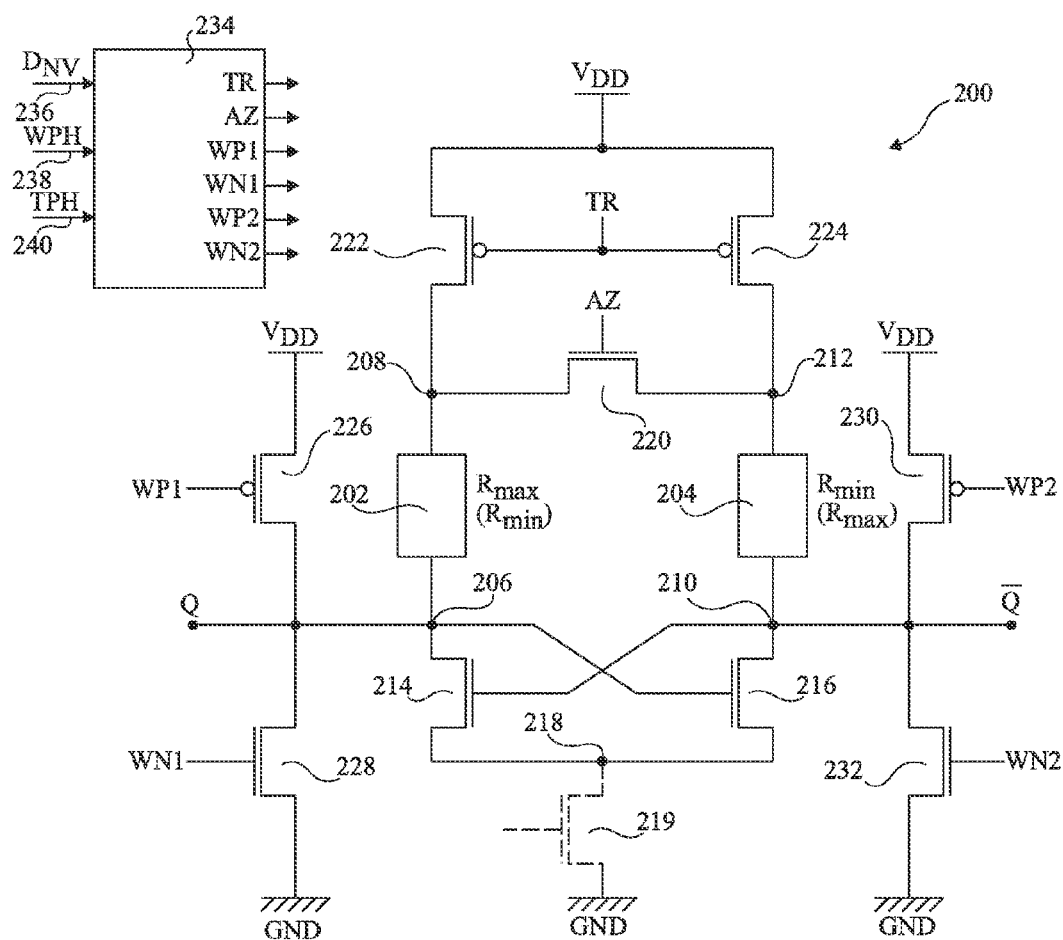
FIG. 2 schematically illustrates a memory cell according to an example embodiment of the present disclosure.

FIG. 2 illustrates a memory cell 200 according to an example embodiment of the present disclosure.

Memory cell 200 comprises resistive elements 202 and 204, which are each capable of being programmed to have one of a plurality of resistive states. The resistive elements 202 and 204 may be any type of resistance switching element for which the resistance is programmable by the direction of a current passed through it. For example, as will be described in more detail below with reference to FIGS. 12A and 12B, the resistance switching elements 202, 204 are spin transfer torque elements with in-plane or perpendicular-to-plane anisotropy, as described in more detail in the publication entitled "Magnonic spin-transfer torque MRAM with low power, high speed, and error-free switching", N. Mojumder et al., IEDM Tech. Digest (2010), and in the publication entitled "Electric toggling of magnets", E. Tsymbal, Natural Materials Vol 11, January 2012. Alternatively, the resistive elements could be those used in RedOx RAM (reduction oxide RAM) resistive switching memories, which are for example described in more detail in the publication entitled "Redox-Based Resistive Switching Memories-Nanoionic Mechanisms, Prospects and Challenges", Rainer Waser et al., Advanced Materials 2009, 21, pages 2632 to 2663. As yet a further example, the resistive elements could be those used in FeRAM (Ferro-Electric RAM) or in PCRAM (phase change RAM).

Whatever the type of resistive elements, a bit of data is for example stored in the memory cell in a non-volatile manner by setting one of the elements at a relatively high resistance ($R_{max}$), and the other at a relatively low resistance ($R_{min}$). In the example of FIG. 2, the element 202 is programmed to have a resistance $R_{max}$ and the element 204 a resistance $R_{min}$ representing one value of the data bit, and as shown by the references $R_{min}$ and $R_{max}$ in brackets, the opposite programming of the resistance values stores the opposite value of the data bit. Each of the resistance switching elements 202, 204 for example has just two resistive states corresponding to the high and low resistances $R_{max}$ and $R_{min}$, but the exact values of $R_{min}$ and $R_{max}$ may vary depending on conditions such as process, materials, temperature variations etc.

The non-volatile data bit represented by the resistive elements 202, 204 depends on which of the resistive elements is at the resistance $R_{max}$ and $R_{min}$, in other words on the relative resistances. The resistive elements 202, 204 are for example selected such that $R_{max}$ is always significantly greater than $R_{min}$, for example at least 20 percent greater. In general, the ratio between the resistance $R_{max}$ and the resistance $R_{min}$ is for example between 1.2 and 10000. $R_{min}$ is for example in the region of 2 k ohms or less, and $R_{max}$ is for example in the region of 6 k ohms or more, although many other values are possible It will be apparent to those skilled in the art that in some embodiments, rather than both of the resistive elements 202, 204 being programmable, only one is programmable. In such a case, the other resistive element for example has a fixed resistance at an intermediate level around halfway between $R_{min}$ and $R_{max}$, for example equal, within a 10 percent tolerance, to $(R_{min}+(R_{max}-R_{min})/2)$. For example, one of the resistive elements 202, 204 could correspond to a resistor of fixed resistance. Alternatively, one of the resistive elements 202, 204 could be formed of a pair of programmable resistive elements coupled in parallel with each other and in opposite orientations, such irrespective of the sense in which each element is programmed, the resistance value remains relatively constant at the intermediate level.

The resistive element 202 is coupled between a storage node 206 and an intermediate node 208. The resistive element 204 is coupled between a storage node 210 and an intermediate node 212. The storage nodes 206 and 210 store voltages Q and respectively. A pair of inverters is cross-coupled between the storage nodes 206 and 210 to form a register. Each inverter is formed by a single transistor 214, 216 respectively. Transistor 214 is for example an n-channel MOS (NMOS) transistor coupled by its main current nodes between node 206 and a further node 218. Transistor 216 is for example an NMOS transistor coupled by its main current nodes between the storage node 210 and the further node 218. A control node of transistor 214 is coupled to the storage node 210, and a control node of transistor 216 is coupled to the storage node 206. The node 218 is either connected to ground, or coupled to ground via the main current nodes of an NMOS transistor 219, shown by dashed lines in FIG. 2.

The intermediate nodes 208 and 212 are coupled together via the main current nodes of an NMOS transistor 220. Transistor 220 receives at its control node a signal AZ described in more detail below.

The node 208 is further coupled to a supply voltage $V_{DD}$ via the main current nodes of a p-channel MOS (PMOS) transistor 222. Similarly, the node 212 is coupled to the supply voltage $V_{DD}$ via the main current nodes of a PMOS transistor 224. Control nodes of the PMOS transistors 222 and 224 are coupled together to a transfer signal TR described in more detail below.

The storage node 206 is further coupled to the supply voltage $V_{DD}$ via the main current nodes of a PMOS transistor 226, and to ground via the main current nodes of an NMOS transistor 228. Transistors 226 and 228 receive at their control nodes write signals WP1 and WN1 respectively. Similarly, the storage node 210 is coupled to the supply voltage $V_{DD}$ via the main current nodes of a PMOS transistor 230, and to ground via the main current nodes of an NMOS transistor 232. Transistors 230 and 232 receive at their control nodes write signals WP2 and WN2 respectively.

FIG. 2 also illustrates a control block 234, providing the control signals TR, AZ, WP1, WN1, WP2 and WN2 to the corresponding transistors of the memory cell 200. As illustrated, these control signals are for example generated based on non-volatile data $D_{NV}$ received on an input line 236, a write phase signal WPH received on an input line 238, and a transfer phase signal TPH received on an input line 240.

In the flip-flop 100 of FIG. 1, transistors MP1 and MP0 are coupled to the supply rail Vdd and perform the role of maintaining a high state at one of the nodes of the register formed by the four transistors MN0, MN1, MP0 and MP1. In the cell 200 of FIG. 2, in which each inverter is implemented by a single transistor 214, 216, the high state of Q or Q is maintained by leakage current passing through the PMOS transistors 222 or 224, and/or through the PMOS transistors 226 and 230.

The threshold voltages of the PMOS transistors 222, 224 and/or 226, 230 are chosen to be lower than those of NMOS transistors 214, 216, 228, 232 such that when in the non-conducting state, the current leakage through transistors 222, 224 and/or 226, 230 is greater than through transistor 214, 216, 228, 232 thereby keeping the corresponding node 206 or 210 at a voltage high enough to be seen as a high logic state. In other words, the leakage current $I_{offP}$ flowing through PMOS transistor 222, 224 and/or 226, 230 when a high voltage is applied to the corresponding gate nodes is greater that the leakage current $I_{offN}$ flowing through the corresponding NMOS transistor 214, 216, 228 or 232 when a low voltage is applied to its gate node.

The particular threshold voltages will depend on the technology used. As an example, the threshold voltages of PMOS transistors 222, 224 and/or 226, 230 are chosen to be in the range 0.3 to 0.5 V, while the threshold voltages of NMOS transistors 214, 216, 228, 232 are in the range 0.4 to 0.6 V. In any case, the ratio $I_{offP}/I_{offN}$ is selected for example to be greater than 25, and preferably greater than 100.

Operation of the circuit of FIG. 2 will now be described in more detail with reference to FIGS. 3A and 3B, and 4A and 4B.

First, it should be noted that, unlike the flip-flop of FIG. 1, the memory cell 200 is capable of storing, in a volatile fashion, a data bit that is independent of the programmed resistive states of the elements 202 and 204. Indeed, the register formed by transistors 214 and 216 will maintain any stored state.

Figure 3A:
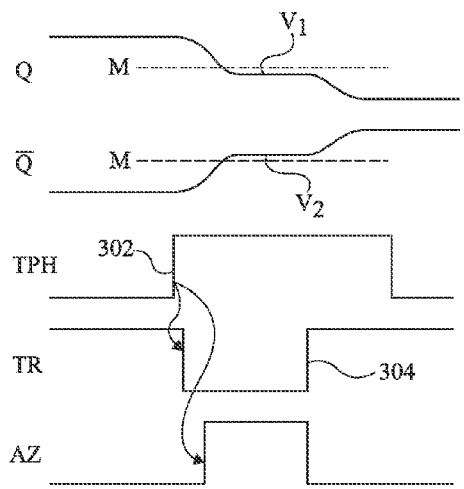
FIGS. 3A and 3B are timing diagrams representing signals in the circuit of FIG. 2 during a data transfer phase according to an example embodiment of the present disclosure.
Figure 3B:
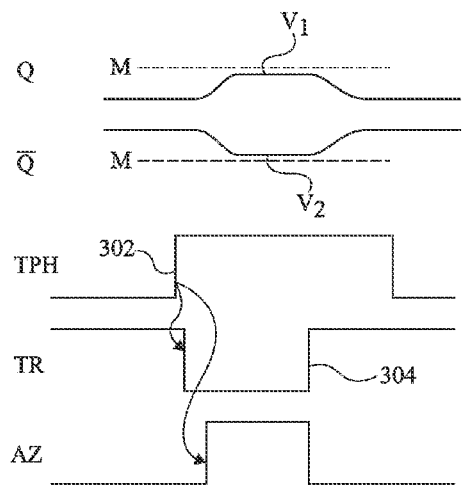

FIGS. 3A and 3B are timing diagrams showing signals in the memory cell of FIG. 2 during a transfer phase. In particular, FIGS. 3A and 3B illustrate the data signals Q and $\overline{Q}$ present at the storage nodes 206 and 210, the transfer phase signal TPH, the transfer signal TR, and the signal AZ during a transfer phase of the circuit.

The transfer phase corresponds to an operation for transferring the data represented by the programmed resistive states of the resistive elements 202 and 204 to the storage nodes 206, 210. Thus, the data is transformed from being represented by the programmed resistive state to being represented by voltage levels at the storage nodes 206 and 210.

Thus the transfer phase involves setting the levels of the voltages Q and $\overline{Q}$ at the storage nodes 206 and 210 based on the programmed resistive states. In the examples of FIGS. 3A and 3B, it is assumed that the resistive element 202 has been programmed to have a high resistance $R_{max}$, and the resistive element 204 a low resistance $R_{min}$. While not shown in FIGS. 3A and 3B, during the transfer phase, the control signals WP1, WP2 are high and the control signals WN1, WN2 are low such that the corresponding transistors 226 to 232 are all non-conducting.

FIG. 3A corresponds to a case in which the voltages Q and $\overline{Q}$ are initially at a high state and low state respectively. The term "high state" is used herein to designate a voltage level close to or at the level of the supply voltage $V_{DD}$, while the term "low state" is used herein to designate a voltage level close to or at the ground voltage.

The transfer signal TR is for example initially high, such that transistors 222 and 224 are non-conducting. The signal AZ is for example initially low, such that transistor 220 is non-conducting.

The transfer phase signal TPH, which is for example initially low, is asserted as shown by a rising edge 302, triggering shortly thereafter a falling edge of the transfer signal TR, and a rising edge of the signal AZ, for example shortly after the falling edge of the transfer signal TR. Thus the transistors 220, 222 and 224 of FIG. 2 are all activated, inducing a current in the left-hand branch of the memory cell 200 that flows through transistor 222, resistive element 202 and transistor 214, and a current in the right-hand branch of the memory cell that flows through transistor 224, resistive element 204 and transistor 216.

However, due to the difference in the resistances of the resistive elements 202 and 204, the current in the left-hand branch is lower than the current in the right-hand branch. Thus these currents for example cause the voltage at storage node 206 to fall and settle at a level $V_1$ below a level of metastability M, and the voltage at storage node 210 to rise to a level $V_2$ above the level of metastability M. The level of metastability M is a theoretical voltage level approximately halfway between the high and low voltage states, representing the level from which there would be equal probability of Q flipping to the high or low states. Asserting the signal AZ to turn on transistor 220 has the effect of speeding up the descent of the voltage level Q, and the rise of the voltage level $\overline{Q}$.

The signal AZ is then brought low, and the transfer signal TR is brought high again at a rising edge 304, such that the levels of Q and $\overline{Q}$ go to their closest stable state, which in the example of FIG. 3A corresponds to the low Q, high $\overline{Q}$ state. However, it will be apparent to those skilled in the art that the levels $V_1$ and $V_2$, and the final stable state, will depend on factors such as the on resistances of the transistors 214, 216, 222 and 224. Finally, the transfer phase signal TPH goes low to complete the transfer phase.

FIG. 3B corresponds to a case in which the voltages Q and $\overline{Q}$ are initially at a low state and high state respectively. The transfer phase signal TPH, transfer signal TR and the signal AZ have the same forms as those in FIG. 3A, and will not be described again. The difference with respect to FIG. 3A is that, when the signal TR is brought low and the signal AZ is brought high, the voltage Q rises to the level $V_1$, and the voltage $\overline{Q}$ falls to the level $V_2$. After that, the levels of Q and $\overline{Q}$ go to their closest stable state, which in the example of FIG. 3B corresponds to the low Q, high $\overline{Q}$ state. However, again it will be apparent to those skilled in the art that the levels $V_1$ and $V_2$, and the final stable state, will depend on factors such as the on resistances of the transistors 214, 216, 222 and 224.

Figure 4A:
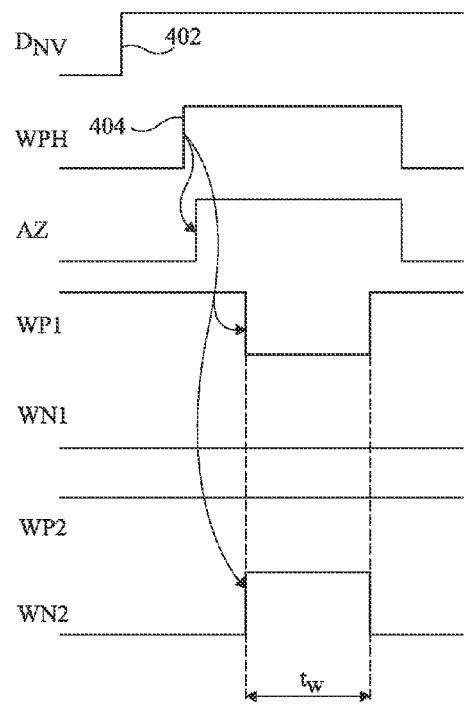
FIGS. 4A and 4B are timing diagrams representing signals in the circuit of FIG. 2 during a write phase according to an example embodiment of the present disclosure.
Figure 4B:
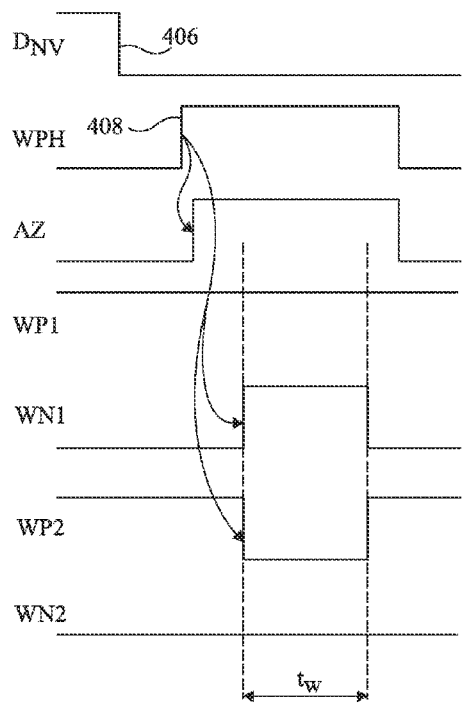

FIGS. 4A and 4B are timing diagrams illustrating examples of the signals $D_{NV}$, WPH, AZ, WP1, WN1, WP2 and WN2 in the circuit of FIG. 2 during a write phase of the resistive states of the resistive elements 202 and 204. While not shown in FIGS. 4A and 4B, during the write phase, the transfer signal TR for example remains high such that transistors 222 and 224 are non-conducting.

The write phase involves passing a current through each of the resistive elements 202, 204 via the transistor 220, either in the direction from the storage node 206 to the storage node 210, or the opposite direction. The resistive elements 202 and 204 are each orientated such that, for a given direction of current, they will be programmed to have opposite resistances. In particular, each resistive element 202, 204 can be orientated in one of two ways between the corresponding storage node 206, 210 and corresponding intermediate node 208, 212. In the case of an STT element, the orientation is determined by the order of a pinned layer and storage layer, as will be described in more detail below. The elements 202, 204 are both for example orientated in the same way between these corresponding nodes, for example each having their pinned layer closest to the corresponding storage node 206, 210, such that they have opposite orientations with respect to a write current flowing from the storage node 206 to storage node 210 or vice versa.

As illustrated in FIG. 4A, initially the signals AZ, WN1 and WN2 are low, and the signals WP1 and WP2 are high, such that transistors 220 and 226 to 232 are all non-conducting.

The data signal $D_{NV}$ on the input line 236 of the control circuit 234 is for example first set to the value that is to be programmed in the memory cell. In the example of FIG. 4A, the value is a logic "1", and the data signal $D_{NV}$ for example starts low, and transitions to a high value at a rising edge 402.

The write phase signal WPH on the input line 238 of the control circuit 234 then goes high at a rising edge 404, initiating the start of the write phase. This triggers, a short time later, a rising edge of the signal AZ, such that the transistor 220 is activated, coupling together the nodes 208 and 212. Furthermore, shortly thereafter, the signals WP1, WN1, WP2 and WN2 are set to appropriate values for causing a current to flow through the resistive elements 202 and 204 in a direction that will program their resistances in accordance with the logic "1" data value that is to be programmed. In the example of FIG. 2, a high state of a data value $D_{NV}$ corresponds to a high value of voltage Q, in other words a resistance $R_{min}$ of element 202, and a resistance $R_{max}$ of element 204. This is for example achieved by passing a current from storage node 206, through the resistive elements 202 and 204, to the storage node 210. As shown in FIG. 4A, this direction of current is generated by bringing signal WP1 low to activate transistor 226, and bringing signal WN2 high to activate transistor 232.

After the current has been applied for a sufficiently long time to set the resistive states of elements 202 and 204, for example for a duration $t_W$ of between 0.1 ns and 20 ns, the signal WP1 is brought high again, and the signal WN2 is brought low, stopping the write current. The signals AZ and WPH then for example brought low, ending the write phase.

FIG. 4B illustrates an alternative case of a write phase in which the data value to be programmed is a logic "0", and thus the data signal $D_{NV}$ has a falling edge 406. A rising edge 408 of the write signal thus triggers a rising edge of the signal WN1 and a falling edge of the signal WP2, in order to generate a current from the storage node 210 through the resistive elements 204 and 202, to the storage node 206, for a duration $t_W$. This programs a resistance $R_{min}$ of element 202, and a resistance $R_{max}$ of element 204.

The transistors 220 and 226 to 232 are for example dimensioned such that the write current generated by activating transistors 226, 220 and 232, or by activating transistors 230, 220 and 228, is high enough to program the resistive states of elements 202 and 204. Depending on the type and dimensions of the resistive elements 202, 204, such a minimum programming current could for example by anything from 20 µA to 1.5 mA. On the contrary, the transistors 214, 216 and 222, 224 are for example dimensioned such that, during a transfer phase when the transfer signal TR is activated, the level of current flowing through the resistive elements 202 and 204 is lower than that needed to program their resistive states, for example a level between 10 and 90 percent lower than the corresponding write current.

Referring to FIG. 1 described above, during a write phase of the MTJ devices, transistor MN7 is necessary in order to disconnect node 102 from ground, and thus to avoid the write current flowing to ground. However, as described above, the transistor 219 between node 218 and ground in the memory cell 200 can be removed. Indeed, because transistors 214 and 216 forming a register are positioned between the storage nodes 206, 210 and ground, the write current will still flow through the resistive elements even if node 218 is coupled to ground during the write phase.

FIG. 5 illustrates a memory cell 500 according to an alternative embodiment to that of FIG. 2. Many features of memory cell 500 are identical to those of the memory cell 200, and these features are labelled with like reference numerals and will not be described again in detail.

A difference in the memory cell 500 is that the transistors 226, 228 and 232 have been removed, leaving only a single transistor 230 dedicated to generating the write current. An additional NMOS transistor 502 is coupled by its main current nodes between the storage node 206 and an input circuit 504. In particular, transistor 502 is coupled to a data input node 506 of the memory cell. Node 506 is coupled to the supply voltage $V_{DD}$ via a circuit block 508 of the input circuit 504, and to ground via a circuit block 510 of the input circuit 504. Transistor 502 is for example controlled by a clock signal CLK. The circuit blocks 508 and 510 are controlled by input data D at an input 512. As will be apparent from the description below, the input data D may comprise a single data signal or more than one data signal for controlling the circuit blocks 508, 510.

Furthermore, bulk voltage nodes of transistors 214 and 216 are illustrated in FIG. 5. The control circuit 234 is also replaced in memory cell 500 by a control circuit 534, which no longer provides the control signals WN1, WP1 and WN2, and optionally provides bulk voltage levels $V_{BULK1}$ and $V_{BULK2}$, which are applied to the bulk voltage nodes of transistors 214 and 216 respectively, as will be described in more detail below.

A transfer phase can be implemented in the circuit 500 in the same fashion as described above in relation to FIGS. 3A and 3B, and will not be described again in detail. During such a transfer phase, the transistor 502 is for example deactivated by a low state of the clock signal CLK, such that storage node 206 is isolated from the input circuit 504.

A write phase of the resistive elements 202 and 204 is implemented using the PMOS transistor 230 or the input circuit 504, depending on the direction of the write current to be applied. In particular, the input circuit 504 corresponds to a typical CMOS-type device comprising, in the circuit block 508, one or more PMOS transistors coupled to the supply voltage $V_{DD}$, and, in the circuit block 510, one or more NMOS transistors, coupled to ground. For example, the input circuit 504 corresponds to an inverter, a multiplexer, a NOR gate, a NAND gate, or other logic circuit.

In order to program the resistive elements 202, 204 with a write current flowing from the storage node 206 to the storage node 210, the transistor 502 is activated, and the circuit block 508 is also activated by an appropriate value of the data signal D to couple the intermediate node 506 to the supply voltage $V_{DD}$. The path from storage node 210 to ground is for example provided by the transistor 216.

In order to program the resistive elements 202, 204 with a write current flowing from the storage node 210 to the storage node 206, the transistor 230 is activated. The path from storage node 206 to ground is either provided uniquely by the transistor 214, or by transistor 214 and additionally by the activation of transistor 502 and of the circuit block 510 by appropriate input data D at input 512.

The input circuit 504, in addition to providing a voltage state at the data input node 506 of the memory cell during a write phase, also for example serves as an input or output interface of the memory cell 500. In particular, the input circuit 504 for example applies a signal at the data input node 506 to program the voltage states Q and $\overline{Q}$ at the storage nodes 206 and 210 while the memory cell is functioning as a standard latch. Thus, the input data D for example sets the data value to be programmed at the storage nodes 206, 210 in a volatile fashion. During a write phase of the programming elements 202, 204, this same data value is for example used to program the resistive states of elements 202, 204 to store the data value in a non-volatile fashion.

Additionally or alternatively, the input circuit 504 may be configured to read the voltage state Q at the storage node 206, and the input circuit 504 for example additionally functions as an output circuit of the memory cell 500.

Advantageously, by using the input circuit 504 and transistor 502 to apply a voltage level to the storage node 206 or 210 during a write phase of the resistive elements 202, 204, the rest of the memory cell 500 of FIG. 5 can comprises just six transistors. Of course, in alternative embodiments, the memory cell 500 of FIG. 5 could additionally comprise the transistors 228, 232 and/or 219 of the embodiment of FIG. 2.

Operation of the memory cell 500 during a write phase will now be described in more detail with reference to FIGS. 6A and 6B.

Figure 6A:
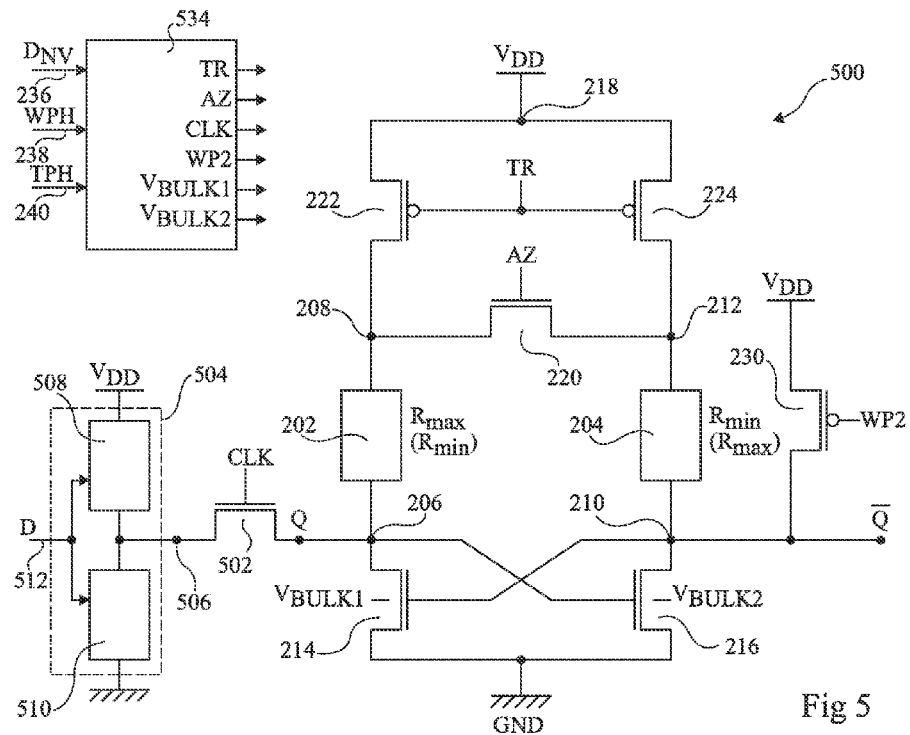
FIGS. 6A and 6B are timing diagrams representing signals in the memory cell of FIG. 5 during a write phase according to an example embodiment of the present disclosure.
Figure 6B:
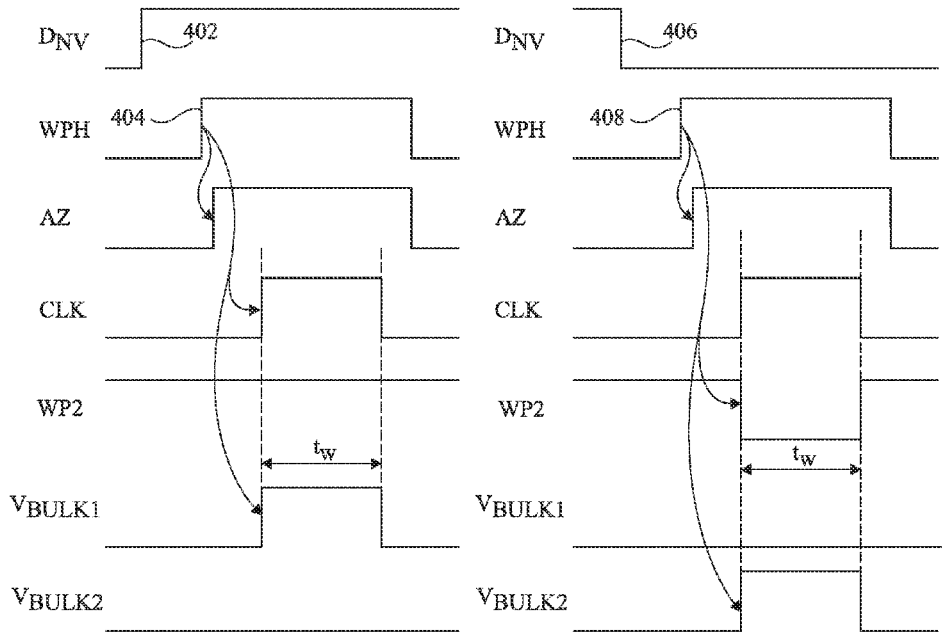

FIGS. 6A and 6B illustrate examples of timings of the signals $D_{NV}$, WPH, AZ, CLK, WP2, $V_{BULK1}$ and $V_{BULK2}$ in the circuit of FIG. 5 during a write phase of the resistive states of the resistive elements 202 and 204. The signals $D_{NV}$, WPH, AZ and WP2 are the same as those in FIGS. 4A and 4B, and will not be described again in detail.

In the example of FIG. 6A, the write current is generated by activating only transistors 502 and 220, and applying appropriate input data D for coupling node 506 to the supply voltage $V_{DD}$. The write current thus flows from storage node 206, through resistive elements 202 and 204, to the storage node 210. Node 206 being at a relatively high voltage, transistor 216 is conducting, and thus the write current flows to ground via transistor 216.

In the example of FIG. 6B, the write current is generated by activating transistors 220 and 230, and optionally transistor 502 assuming that the node 506 is coupled to ground via the circuit block 510. The write current thus flows from storage node 210, through resistive elements 204 and 202, to the storage node 206. Node 210 being at a relatively high voltage, transistor 214 is conducting, and thus the write current flows to ground via transistor 214, and optionally also via the circuit block 510.

The control of the bulk voltages $V_{BULK1}$ and $V_{BULK2}$ of transistors 214 and 216 can be used to increase the write current, as will now be described.

Referring again to FIGS. 6A and 6B, the bulk voltages $V_{BULK1}$ and $V_{BULK2}$ applied to the transistors 214 and 216 respectively are for example at ground, except during the write phase. During the write phase, the bulk voltage of one of the transistors is switched to a voltage level above ground, for example at the supply voltage $V_{DD}$, at least during the write period $t_W$.

In the example of FIG. 6A, the write current flows from storage node 206 to storage node 210. Therefore, the bulk voltage $V_{BULK1}$ of transistor 214 is increased to reduce current leakage flowing to ground via transistor 214. The bulk voltage $V_{BULK2}$ of transistor 216 however remains low, such that transistor 216 remains fully conducting.

In the example of FIG. 6B, the write current flows from storage node 210 to storage node 206. Therefore, the bulk voltage $V_{BULK2}$ of transistor 216 is increased to reduce current leakage flowing to ground via transistor 216. The bulk voltage $V_{BULK1}$ of transistor 214 however remains low, such that transistor 214 remains fully conducting.

Figure 7A:
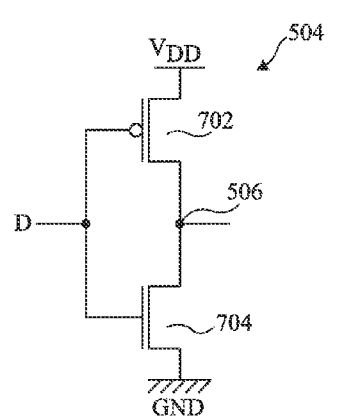
FIGS. 7A and 7B schematically illustrate circuits of the memory cell of FIG. 5 in more detail according to example embodiments of the present disclosure.
Figure 7B:
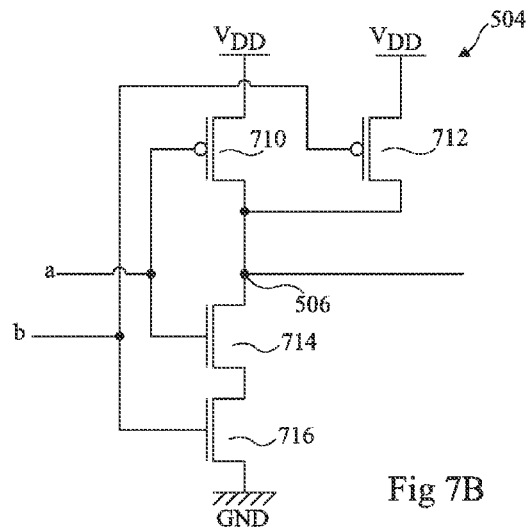

FIGS. 7A and 7B illustrate the input circuit 504 of FIG. 5 in more detail according to example embodiments.

FIG. 7A illustrates the case in which the input circuit 504 is an inverter, comprising a PMOS transistor 702 coupled by its main current terminals between node 506 and the supply voltage $V_{DD}$, and an NMOS transistor 704 coupled by its main current terminals between the node 506 and ground. Thus a low state of the data signal D will cause node 506 to be coupled to the supply voltage $V_{DD}$ via transistor 702.

FIG. 7B illustrates the case in which the input circuit 504 is a NAND gate, comprising PMOS transistors 710 and 712 coupled in parallel between node 506 and the supply voltage $V_{DD}$, and NMOS transistors 714, 716 coupled in series between node 506 and ground. The input data D comprises a pair of data signals a and b. The transistors 710 and 714 are controlled by the data signal a, and the transistors 712 and 716 are controlled by the data signal b. Thus, when the signal a and/or b is low, the node 506 is coupled to the supply voltage $V_{DD}$ via transistor 710 and/or 712.

More generally, the circuit blocks 508 and 510 of the input circuit 504 are for example configured to apply to the input data D at least one of the group of logic functions comprising: a multiplexing function; a NOT function; a NOR function; a NAND function; an XNOR function; an OR function; an AND function; and an XOR function.

Figure 8:
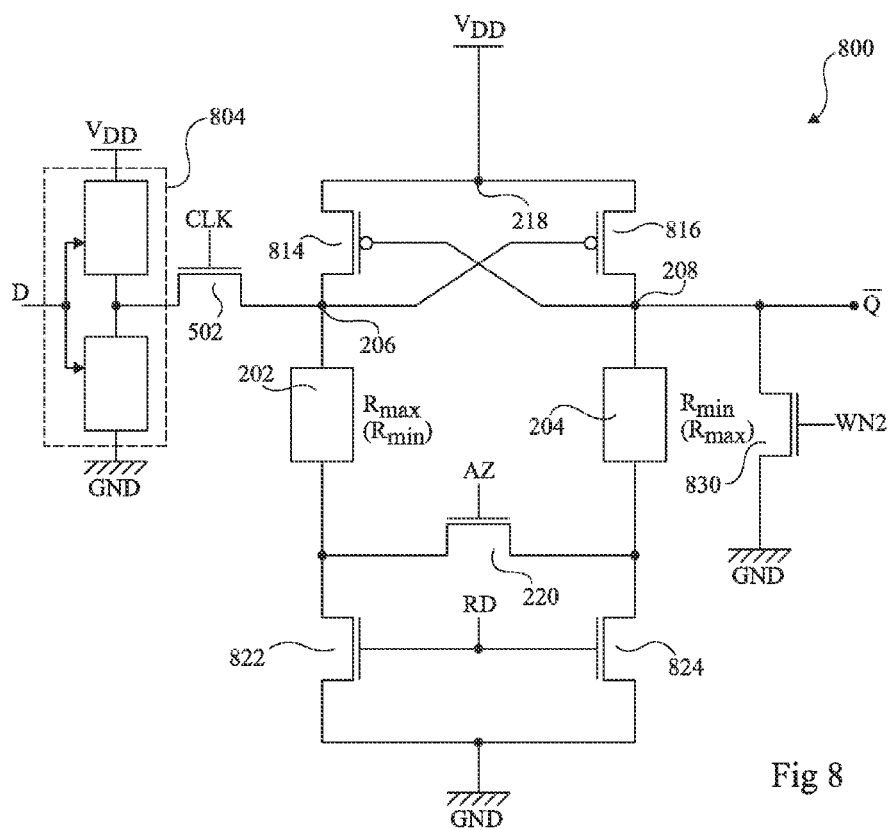
FIG. 8 schematically illustrates a memory cell according to a further example embodiment of the present disclosure.

FIG. 8 illustrates a memory cell 800 according to an alternative embodiment to that of FIG. 5. Many features are the same as those of FIG. 5, and these elements will not be described in detail. The difference in the circuit of FIG. 8 is that NMOS transistors are replaced by PMOS, and vice versa. In particular, the NMOS transistors 214 and 216 have been replaced by PMOS transistors 814 and 816. The node 218 is connected to the supply voltage $V_{DD}$. Furthermore, the PMOS transistors 222 and 224 have been replaced by NMOS transistors 822 and 824 coupled to ground. The PMOS transistor 230 has been replaced by an NMOS transistor 830 coupled to ground.

It will be apparent to those skilled in the art that the operation of the memory cell of FIG. 8 is substantially similar to that of the memory cell of FIG. 5, the only difference being the normal voltage inversions resulting from the NMOS/PMOS exchange. For ease of illustration, a control circuit based on the control circuit of 534 of FIG. 5 is not illustrated in FIG. 8. Furthermore, while not shown in FIG. 8, the bulk voltages of one of the transistors 814, 816, which are for example normally at the supply voltage $V_{DD}$, could be brought to a lower value, for example to ground, during a write phase, like in the method described above in relation to FIG. 5.

Figure 9:
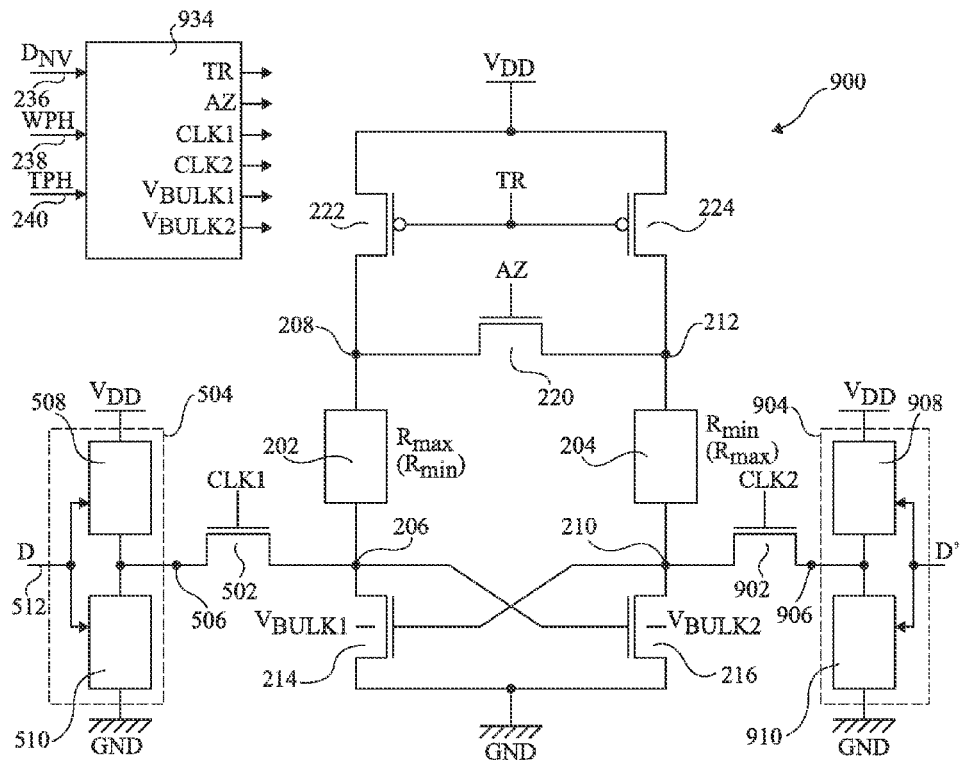
FIG. 9 schematically illustrates a memory cell according to yet a further example embodiment of the present disclosure.

FIG. 9 illustrates a memory cell 900 according to an alternative embodiment to that of FIG. 5. Many features are the same as those of FIG. 5, and these elements will not be described in detail. The difference in the circuit of FIG. 9 is that the PMOS transistor 230 is no longer present, and instead, the storage node 210 is coupled via the main current nodes of an NMOS transistor 902 to a further input circuit 904. In particular, transistor 902 is coupled to a data input node 906 of the memory cell 900. Node 906 is coupled to the supply voltage $V_{DD}$ via a circuit block 908 of the input circuit 904, and to ground via a circuit block 910 of the input circuit 904. Transistor 502 in FIG. 9 is controlled by a clock signal CLK1, and transistor 902 is controlled by a clock signal CLK2. The circuit blocks 908 and 910 are controlled by input data D'. As with the input data D, the input data D' may comprise a single data signal or more than one data signal.

As with the input circuit 504, the input circuit 904 could correspond to the circuit of FIGS. 7A and 7B, or more generally, any logic circuit that is for example configured to apply to the input data D at least one of the group of logic functions comprising: a multiplexing function; a NOT function; a NOR function; a NAND function; an XNOR function; an OR function; an AND function; and an XOR function.

Operation of the memory cell 900 is similar to that of FIG. 5, except that, in order to generate a write current from the storage node 210 through the resistive elements 202 and 204 to the storage node 206, transistor 902 is activated and the node 906 is coupled to the supply voltage $V_{DD}$ via the circuit block 908 by an appropriate value of the data signal D'.

Thus, by using both the transistors 502, 902 and the input circuits 504, 904 to apply voltages to the storage nodes 206 and 210 during write phases of the resistive elements 202, 204, the rest of the memory cell 900 can be implemented using just five transistors.

Figure 10:
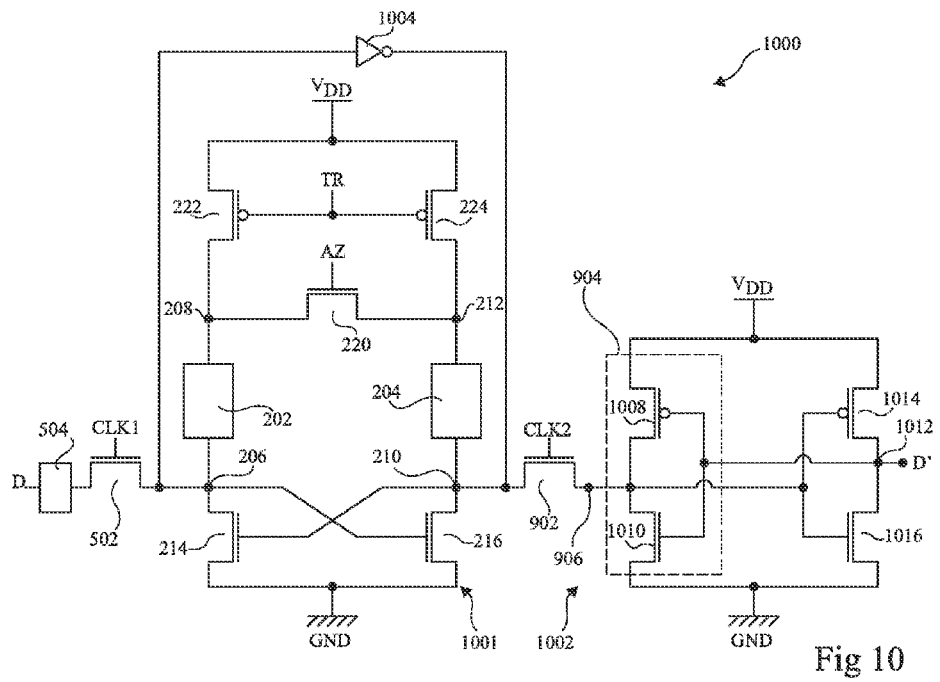
FIG. 10 schematically illustrates a synchronous memory device according to an example embodiment of the present disclosure.

FIG. 10 illustrates a synchronous memory device 1000 based on the circuit of FIG. 9, according to an example embodiment. Of course, in an alternative embodiment, the memory device 1000 could equally be based on the memory cell of FIG. 5 or 8. The synchronous memory device 1000 of FIG. 10 is a flip-flop, and in particular a D-type flip-flop. However, it will be apparent to those skilled in the art that other types of synchronous memory devices could also be implemented based on the same principles.

The storage nodes 206, 210 and transistors 214, 216 form a master register 1001 of the memory device 1000, while the circuit 904 forms part of a slave register 1002 of the memory device 1000, coupled in series with the master register 1001 via the transistor 902. The storage node 206 is further coupled to the storage node 210 of the memory cell 1001 via an inverter 1004.

The circuit 904 of the slave register 1002 is an inverter comprising a PMOS transistor 1008 coupled between node 906 and the supply voltage $V_{DD}$, and an NMOS transistor 1010 coupled between the node 906 and ground. The slave register 1002 comprises a further inverter formed by a PMOS transistor 1014 and an NMOS transistor 1016 coupled in series between $V_{DD}$ and ground. The control nodes of transistors 1014 and 1016 are coupled to node 906, and the control nodes of transistors 1008 and 1010 are coupled to a node 1012 between the transistors 1014 and 1016. The transistors 1014 and 1016 provide the input data D' at node 1012, which is for example an output node of the synchronous memory device 1000.

In operation, irrespective of the programmed resistive states of the resistive elements 202 and 204, the synchronous memory device 1000 can operate as a standard flip-flop, storing data at its storage nodes 206, 210 and 906, 1012 in a volatile fashion, based on input data D presented at the input of circuit 504. In particular, on a rising edge of the clock CLK1, the output of the input circuit 504 is stored at the storage node 206 and its inverse is stored at node 210. Then, on a rising edge of the clock signal CLK2, the data at storage node 210 is stored at the storage node 906, and its inverse is stored at the storage node 1012.

In addition, data may be stored in a non-volatile manner by programming the resistive states of the memory elements 202 and 204, as described above. This data may also be transferred to the storage nodes 206 and 210 by activating, while the clock signals CLK1 and CLK2 are low, the transistors 222 and 224 during a transfer phase as described above, and the data then becomes accessible at the D' output of the flip-flop 1000 after the subsequent rising clock edge of the clock signal CLK2.

During a write phase of the resistive elements 202, 204, to generate a current from the storage node 206 through elements 202, 204 to the storage node 210, the signal CLK1 is brought high to activate transistor 502, and the storage node 206 is coupled to the supply voltage $V_{DD}$ via the input circuit 504.

During a further write phase, to generate a current from the storage node 210 through elements 202, 204 to the storage node 206, the signal CLK1 is for example again brought high to activate transistor 502, and the storage node 206 is coupled to the ground via the input circuit 504. The inverter 1004 will then apply a relatively high voltage to the storage node 210. Additionally the clock signal CLK2 may be brought high to activate transistor 902, and the storage node 210 coupled to the supply voltage $V_{DD}$ via transistor 1008, based on a low state of the data signal D'.

It will be apparent to those skilled in the art that in alternative embodiments, the positions of the registers 1001 and 1002 of FIG. 10 could be swapped, the circuit 1001 forming the master register and the circuit 1001 forming the slave register.

Figure 11:
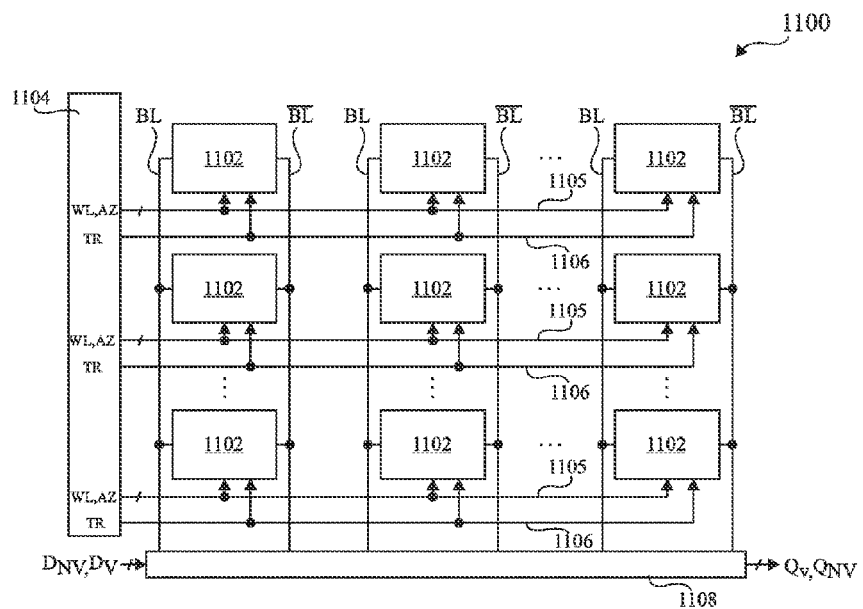
FIG. 11 schematically illustrates a memory array according to an example embodiment of the present disclosure.

FIG. 11 illustrates a memory array 1100 comprising an array of memory cells 1102. In the example of FIG. 11, there are nine memory cells 1102 arranged in three rows and three columns. However there could be as few as two rows and/or two columns, or, as represented by dotted lines in FIG. 11, there could be more than three rows and/or more than three columns.

Each memory cell 1102 for example corresponds substantially to the memory cell of FIG. 9 described above, in which the transistors 502 and 902 are coupled to corresponding bit lines BL and $\overline{BL}$ respectively. Furthermore, both of these transistors are controlled by the same signal WL described in more detail below. Furthermore, the control circuit 934 of each memory cell has been replaced by common row and column control blocks, as will now be described.

A row control block 1104 provides control signals on row lines 1105 to the memory cells, one group of common row lines 1105 being provided for each row. For example, each group of row lines 1105 comprises a word line signal WL for controlling the transistors 502, 902 of each memory cell 1102. Furthermore, this group of row lines 1105 for example comprises the signal AZ for controlling the transistor 220 of each memory cell. The row control block 1104 for example also provides the transfer signal TR to each memory cell on a corresponding row line 1106, a common row line 1106 being provided for the memory cells of each row. The transfer signals control the transistors 222, 224 of the memory cell 200.

A column control block 1108 for example receives the data $D_V$ to be stored in a volatile fashion by a row of memory cells during a standard write operation, and data $D_{NV}$ to be stored in a non-volatile fashion by each of the memory cells during a write phase of the resistive elements 202, 204 of each memory cell 1102. The column control block 1108 is coupled to each of the bit lines BL and $\overline{BL}$, and comprises, for each pair of bit lines BL and $\overline{BL}$, common input circuits 504, 904 for each of the memory cells.

In operation, during a write phase of the resistive elements 202, 204 in each of the memory cells 1102, one row of memory cells is programmed at a time. Programming is for example performed by activating the word line signal WL and the signal AZ of each of the memory cells of the row to be programmed, to activate the corresponding transistors 220, 502 and 902. This creates a conduction path between the bit lines BL and $\overline{BL}$ of each column, passing through the resistive elements 202, 204 of each memory cell. The bit line BL or $\overline{BL}$ of each column is then selectively coupled to the supply voltage $V_{DD}$ to generate the write current in a direction depending on the data $D_{NV}$ to be programmed.

To implement a transfer phase such that the data stored by the resistive elements 202, 204 is transferred to the storage nodes 206, 210, the transfer signal TR and the signal AZ are asserted as described in relation to FIGS. 3A and 3B above, and this operation may be performed on each memory cell 1102 at once. The data may then be read from each memory cell row by row in a standard fashion.

In addition to the storage of data in a non-volatile fashion, data may be stored in a volatile fashion in each memory cell in the same way as with a RAM memory.

Figure 12A:
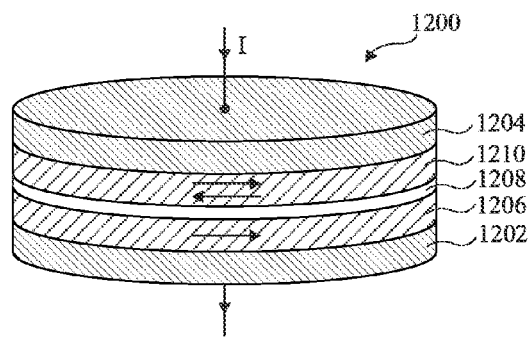
FIGS. 12A and 12B illustrate resistive elements based on magnetic tunnelling junctions according to example embodiments of the present disclosure.
Figure 12B:
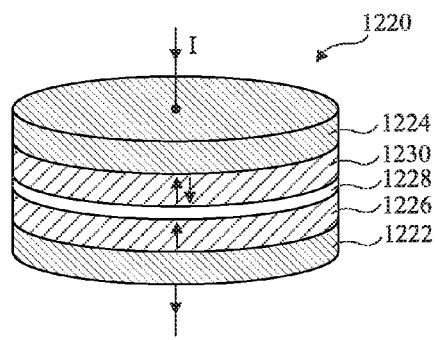

FIGS. 12A and 12B illustrate the structures of resistive spin transfer torque (STT) elements according to example embodiments. For example, the resistive element 202 and/or 204 described herein each has a structure corresponding to that of FIG. 12A or 12B. Alternatively, as mentioned above, the resistive elements could be RedOx RAM elements, FeRAM elements, PCRAM elements, or other types of resistive elements having a resistance programmable by the direction of current flow.

FIG. 12A illustrates an STT resistive element 1200 with in-plane magnetic anisotropy. The element 1200 is for example substantially cylindrical, but has a cross-section which is non-circular, for example oval, which leads for example to an increase in the retention stability of the resistive states when the device is programmed.

The element 1200 comprises bottom and top electrodes 1202 and 1204, each being substantially disc-shaped, and sandwiching a number of intermediate layers between them. The intermediate layers comprise, from bottom to top, a pinned layer 1206, an oxidation barrier 1208, and a storage layer 1210.

The oxidation barrier 1208 is for example formed of MgO or $Al_xO_y$. The pinned layer 1206 and storage layer 1210 are for example ferromagnetic materials, such as CoFe. The spin direction in the pinned layer 1206 is fixed, as represented by an arrow from left to right in FIG. 12A. Of course, in alternative embodiments the spin direction could be from right to left in the pinned layer 1206. However, the spin direction in the storage layer 1210 can be changed, as represented by arrows in opposing directions in FIG. 12A. The spin direction is programmed by the direction of the write current I passed through the element, such that the spin direction in the storage layer is parallel, in other words in the same direction, or anti-parallel, in other words in the opposite direction, to that of the pinned layer 1206.

FIG. 12B illustrates an STT resistive element 1220 with perpendicular-to-plane magnetic anisotropy. Such a resistive element can for example be programmed by a lower write current I than the element 1200 for a given size and/or for a given storage layer volume. Such an element is therefore for example used in the memory cell 500 of FIG. 5, where a relatively low write current is desirable.

Element 1220 is substantially cylindrical, and for example has a cross-section which is circular. The element 1220 comprises bottom and top electrodes 1222 and 1224, each being substantially disc-shaped and sandwiching a number of intermediate layers. The intermediate layers comprise, from bottom to top, a pinned layer 1226, an oxidation barrier 1228, and a storage layer 1230. These layers are similar to the corresponding layers 1206, 1208 and 1210 of element 1200, except that the pinned layer 1226 and storage layer 1230 have perpendicular-to-plane anisotropy, as represented by the vertical arrows in layers 1226 and 1230 of FIG. 12B. The pinned layer 1226 is illustrated as having a spin direction from bottom to top in FIG. 12B, but of course, in alternative embodiments, this spin direction could be from top to bottom.

If the STT element 1200 or 1220 of FIG. 12A or 12B is used to implement each of the resistive elements 202, 204 described herein, their orientations can for example be chosen to minimize the level of write current that allows them to be programmed. In particular, depending on factors such as the dimensions of the elements 202, 204, a low write current may be possible when each element has its bottom electrode 1202, 1222 connected to the corresponding storage node 206, 210, or the opposite may be true.

Having thus described several illustrative embodiments, various alterations, modifications and improvements will readily occur to those skilled in the art.

For example, it will be apparent to those skilled in the art that the supply voltage $V_{DD}$ in the various embodiments could be at any level, for example between 1 and 3 V, and rather that being at 0 V, the ground voltage can also be considered as a supply voltage that could be at any level, such as a negative level.

Furthermore, it will be apparent to those skilled in the art that, in any of the embodiments described herein, all of the NMOS transistors could be replaced by PMOS transistors and/or all of the PMOS transistors could be replaced by NMOS transistors. It will be apparent to those skilled in the art how any of the circuits could be implemented using only PMOS or only NMOS transistors. Furthermore, while transistors based on MOS technology are described throughout, in alternative embodiments other transistor technologies could be used, such as bipolar technology.

Furthermore, it will be apparent to those skilled in the art that the various features described in relation to the various embodiments could be combined, in alternative embodiments, in any combination.

The invention claimed is:

1. A memory cell comprising:
    first and second resistive elements, at least one of which is programmable to have one of at least two resistive states, a data value being represented by the relative resistances of the first and second resistive elements, the first resistive element being coupled between a first storage node and a first intermediate node, the second resistive element being coupled between a second storage node and a second intermediate node;
    a first transistor coupled between said first storage node and a first supply voltage;
    a second transistor coupled between said second storage node and said first supply voltage, wherein a control node of said first transistor is coupled to said second storage node and a control node of said second transistor is coupled to said first storage node;
    a third transistor coupled between the first and second intermediate nodes;
    a fourth transistor coupled by its main current nodes between said first storage node and a data input node; and
    control circuitry configured, during a write phase, to activate said third and fourth transistors and to couple said data input node to a second supply voltage via a first circuit block to generate a current in a first direction through said first and second resistive elements to program the resistive state of at least one of said elements.

2. The memory cell of claim 1, wherein said first circuit block comprises at least one transistor coupled between said data input node and said second supply voltage and controlled by input data of said memory cell.

3. The memory cell of claim 1, further comprising a second circuit block comprising at least one transistor coupled between said data input node and said first supply voltage and controlled by said input data of said memory cell.

4. The memory cell of claim 3, wherein said first and second circuit blocks are configured to apply to said input data at least one of a multiplexing function; a NOT function; a NOR function; a NAND function; an XNOR function; an OR function; an AND function; and an XOR function.

5. The memory cell of claim 1, further comprising a fifth transistor coupled between said second storage node and said second supply voltage, wherein said control circuitry is further configured, during a further write phase, to activate said third and fifth transistors to generate a programming current in a second direction through said first and second resistive elements to program the resistive state of at least one said elements.

6. The memory cell of claim 1, further comprising a sixth transistor coupled between said second storage node and a further data input node, wherein said control circuitry is further configured, during a further write phase, to activate said third and sixth transistors and to couple said further data input node to said second supply voltage via a further circuit block to generate a programming current in a second direction through said first and second resistive elements to program the resistive state of at least one of said elements.

7. The memory cell of claim 3, further comprising an inverter coupled between said first storage node and said second storage node, wherein said control circuitry is further configured, during a further write phase, to activate said third and fourth transistors and to couple said data input node to said first supply voltage via said second circuit block to generate a programming current in a second direction through said first and second resistive elements to program the resistive state of at least one of said elements.

8. The memory cell of claim 1, wherein each of said first and second transistors is connected to said first supply voltage.

9. The memory cell of claim 1, wherein at least one of said first and second resistive elements is one of:
   a spin transfer torque element with in-plane anisotropy;
   a spin transfer torque element with perpendicular-to-plane anisotropy;
   a reduction oxide element;
   a ferro-electric element; and
   a phase change element.

10. The memory cell of claim 1, wherein each of said first and second transistors comprises a bulk node, and wherein said control circuitry is further configured to couple the bulk node of at least one of said first and second transistors to a third supply voltage different from said first supply voltage while said data input node is coupled to said second supply voltage.

11. The memory cell of claim 1, further comprising
    a seventh transistor coupled between said first intermediate node and said second supply voltage; and
    an eighth transistor coupled between said second intermediate node and said second supply voltage.

12. The memory cell of claim 11, wherein said seventh and eighth transistors are adapted to have a lower threshold voltage than said first and second transistors.

13. A memory device comprising:
    an array of the memory cells, each memory cell comprising the memory cell of claim 1, wherein said data input nodes of said memory cells are coupled to first bit lines of said memory device.

14. A synchronous memory device comprising:
    the memory cell of claim 1; and
    a further memory cell coupled in series with said memory cell, the further memory cell comprising a pair of cross-coupled inverters.

15. A method of non-volatile storage of a data value in a memory cell, the memory cell comprising: first and second resistive elements, at least one of which is programmable to have one of at least two resistive states, a data value being represented by the relative resistances of the first and second resistive elements, the first resistive element being coupled between a first storage node and a first intermediate node, the second resistive element being coupled between a second storage node and a second intermediate node; a first transistor coupled between said first storage node and a first supply voltage; a second transistor coupled between said second storage node and said first supply voltage, wherein a control node of said first transistor is coupled to said second storage node and a control node of said second transistor is coupled to said first storage node; a third transistor coupled between the first and second intermediate nodes; a fourth transistor coupled by its main current nodes between said first storage node and a data input node, the method comprising:
    activating said third and fourth transistors;
    coupling said data input node to a second supply voltage via a first input circuit block while said third and fourth transistors are activated to generate a programming current in a first direction through said first and second resistive elements to program the resistive state of at least one of said elements.

* * * * *